United States Patent [19]

Hasebe et al.

[11] Patent Number: 4,755,442
[45] Date of Patent: Jul. 5, 1988

[54] PATTERN DEVELOPING PROCESS AND APPARATUS THEREFOR

[75] Inventors: Hiroyuki Hasebe; Masayuki Suzuki, both of Yokohama; Yasuo Matsuoka, Kawasaki; Takashi Tsuchiya, Kitakami; Kinya Usuda, Yokohama, all of Japan

[73] Assignee: Kabushiki Kaisha Toshiba, Kawasaki, Japan

[21] Appl. No.: 895,675

[22] Filed: Aug. 11, 1986

[30] Foreign Application Priority Data

Aug. 19, 1985 [JP] Japan .................. 60-181388
Aug. 19, 1985 [JP] Japan .................. 60-181389

[51] Int. Cl.$^4$ ................................. G03C 5/00
[52] U.S. Cl. .................... 430/30; 430/296; 430/325; 430/326; 156/627
[58] Field of Search ........... 430/30, 296, 325, 326, 430/331; 156/626, 627

[56] References Cited

U.S. PATENT DOCUMENTS 4,621,037 11/1986 Kanda et al. .................. 430/30

FOREIGN PATENT DOCUMENTS 54-10677  1/1979  Japan .
55-31639  3/1980  Japan .................. 430/30
56-501226 8/1981  Japan .
758054    8/1980  U.S.S.R. .............. 430/30

Primary Examiner—John E. Kittle
Assistant Examiner—José G. Dees
Attorney, Agent, or Firm—Oblon, Fisher, Spivak, McClelland & Maier

[57] ABSTRACT

A resist is coated on a photomask and a predetermined pattern is exposed on the resist. The photomask is dipped in a developing solution together with an electrode which exhibits a stable potential in the developing solution, so that a change in current flowing between the photomask and the electrode is detected on the basis of a change in capacitance between the photomask and the developing solution, while developing the pattern formed on the resist. The current abruptly changes (e.g., exhibits its peak) around the time at which the resist is removed and a chromium underlying layer of the photomask is exposed. The time obtained by multiplying the time until the change appears by a predetermined coefficient is regarded as the time corresponding to the end of the developing step.

19 Claims, 13 Drawing Sheets

F I G. 1
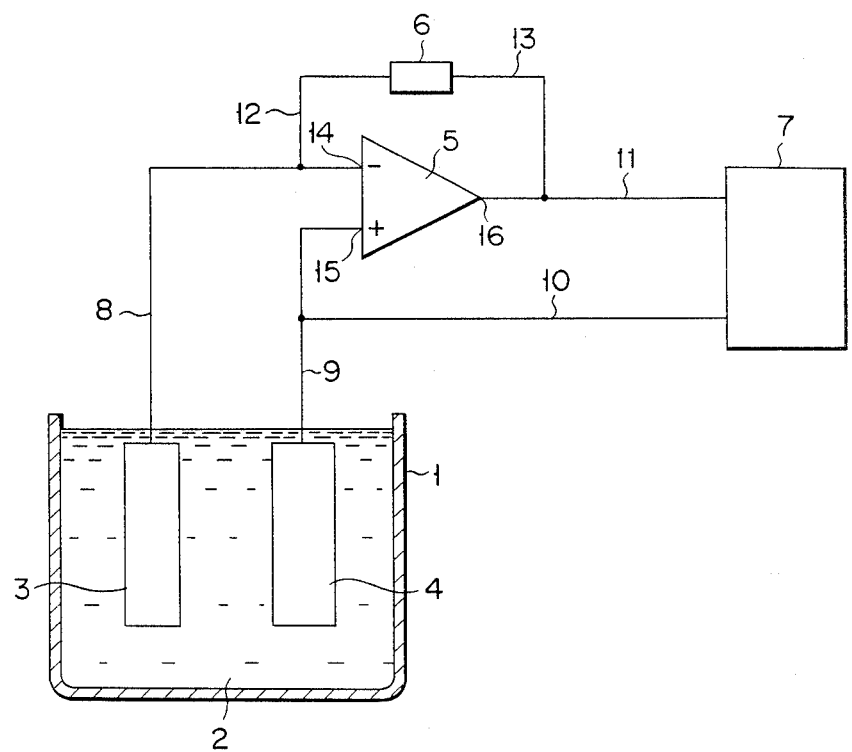

F I G. 2
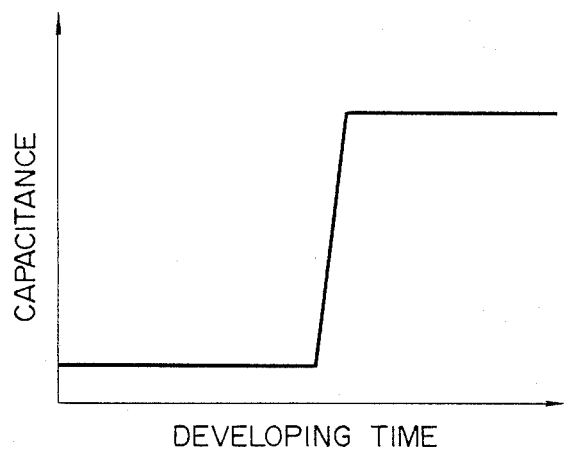
F I G. 3
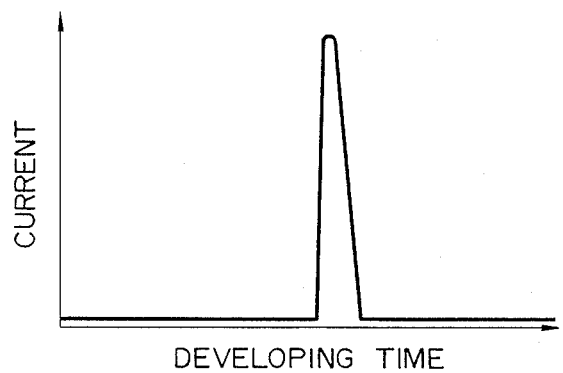

F I G. 6
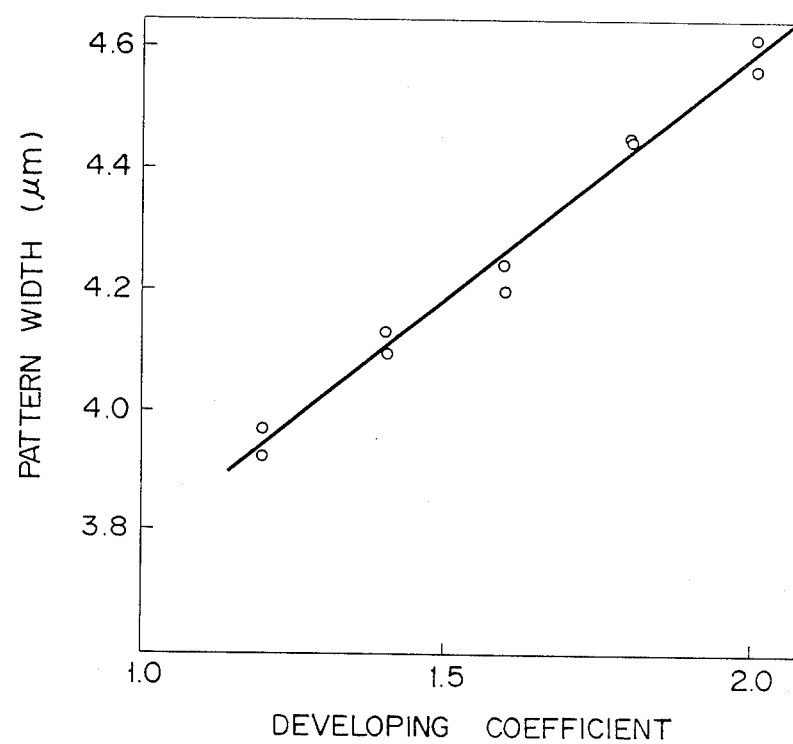

F I G. 22
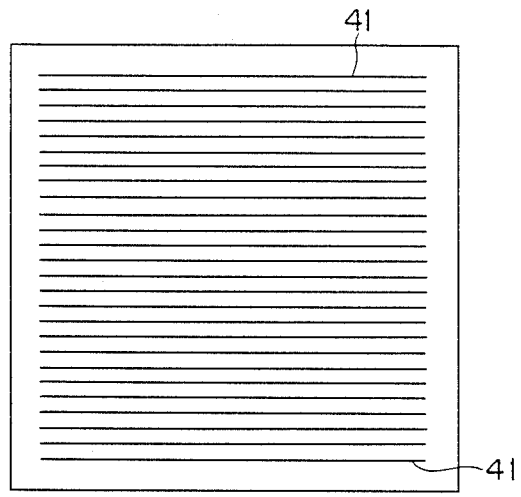
F I G. 23
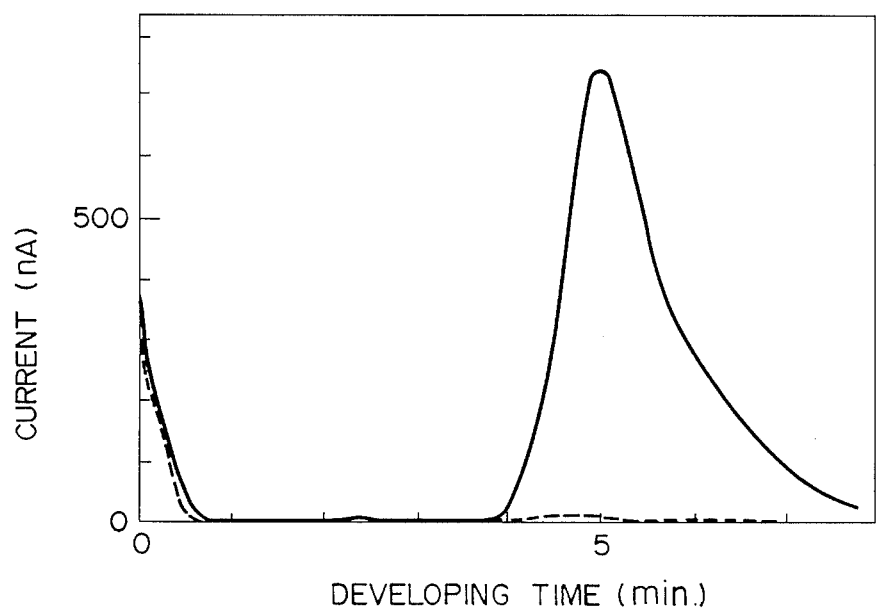

PATTERN DEVELOPING PROCESS AND APPARATUS THEREFOR

BACKGROUND OF THE INVENTION

The present invention relates to a pattern developing process and an apparatus therefor, which can detect completion of resist development.

In recent years, many highly integrated, high-speed semiconductor devices have been developed. This has required high-precision micropatterning of various circuits formed on semiconductor wafers.

In order to satisfy such a requirement, various improvements have been made. For example, as regards the lithography technique, extensive studies have been made about use of short wavelength X-rays instead of conventional ultraviolte ray as a light source when a resist is exposed through a mask. In a method of manufacturing a mask, the conventional method of exposing a pattern with ultraviolet ray is being replaced with a method of exposing a pattern with electron beams which allows micropatterning.

A method of manufacturing a photomask or an X-ray mask by electron-beam lithography will be described. A metal film is formed by deposition or sputtering on a substrate which is transparent in a wavelength range of an exposure light source. Next, an electron-beam resist is coated on the metal film, and a desired pattern is exposed with electron beam. Thereafter, the drawn pattern is developed to selectively remove the electron-beam resist, thus forming a resist pattern. The metal film is etched using the remaining resist pattern as a mask to form a desired mask pattern. Thereafter, the resist pattern is removed to form a mask.

An electron-beam resist coated on a semiconductor wafer can be directly exposed with electron beam without using a lithography technique, thus obtaining a still finer pattern. In this electron-beam exposure technique, the electron-beam resist is coated on the semiconductor wafer and a desired pattern is exposed thereon by use of electron beam. Next, the exposed pattern is developed to selectively remove the electron-beam resist, thus forming a resist pattern. A semiconductor layer or metal film on a semiconductor substrate is etched or doped using the remaining resist pattern as a mask to form a desired circuit pattern and element. Thereafter, the resist pattern is removed.

However, when a micro mask pattern is formed on the electron-beam resist as described above, the developing temperature greatly influences the developing speed, and therefore, the period of the developing step. The developing period is set based on experience, but the period thus set is not always the optimum. This is because the developer contains an inorganic solvent such as ketone or alcohol, which evaporates from the surface of the developer in a developing tank and deprives heat, thus making the temperature distribution of the developer nonuniform. Hence, the developing step must be repeated to accurately determine the actual developing time. Even though a proper time can be determined through repeated tests, if the developer temperature varies widely during such tests, this renders the test results inaccurate. The developing rate is also influenced by the dose of electron beam, variations among manufacturing lots of resist, degradation in developer, baking conditions after coating the resist, and the like. Therefore, although the developing step is performed for a predetermined period of time, a wafer or a mask is often underdeveloped or overdeveloped, and the size of the formed pattern may be greatly differnt from design values and cannot therefore meet the required level of precision.

In order to solve this problem, the developing time is gradually changed by an operator while repeating the developing step. However, since the variation factors (e.g., the temperature of the developer) are not always constant, this method has low reliability and poor reproducibility, and does not allow formation of patterns with high precision.

In addition, a technique for determining completion of development, which utilizes a change in reflectance of laser beams radiated on a resist pattern during development, has been studied. However, such an optical method is influenced by the refractive index of the developer and scattering of the laser beam in the developer, thus resulting in poor reliability.

Another method for determining the developing end point has been described in PCT application No. WO81/00646. In this technique, a wafer and an electrode which is kept at a constant potential by a bias means and is connected to the wafer, are dipped in a conductive developer, and an insulating resist is removed by the developer. Then, the completion of pattern development is determined from a change in voltage when the electrode and the wafer are electrically connected and a circuit is formed. More specifically, electrical connection is detected when the voltage exceeds a predetermined threshold value. However, this technique simply utilizes the Ohm's law where, when electrical resistance of the resist is decreased and the circuit is formed, a current flows, and which is converted into voltage. The voltage rises abruptly when the electrode and the wafer are electrically connected. However, this change in voltage depends on types of wafer, and it is difficult to determine the completion of development, regardless of the type of the wafer. In this technique, when the voltage exceeds a predetermined threshold value, the completion of development is detected. However, such a method can hardly set an optimal developing time for each wafer. For this reason, in this technique, the developing time for each different type of wafer to be mass-produced is corrected using test wafers. This results in a time-consuming process and it is difficult to obtain a desired patteren size with high precision.

SUMMARY OF THE INVENTION

It is an object of the present invention to provide a pattern developing process and an apparatus therefor, which can form a resist pattern with high precision.

According to an aspect of the present invention, there is provided a pattern developing process, comprising a resist forming step of forming a resist film on a surface of a conductor, a pattern forming step of forming a predetermined pattern on the resist film, a developing step of developing the pattern, such that the conductor on which the resist pattern is formed is dipped in a developer containing an organic solvent to selectively remove the resist film, a detecting step in which an electrode exhibiting a stable potential in the developer is dipped in the developer to detect a change in an electrochemical parameter between the electrode and the conductor, based on a change in capacitance between the conductor and the developer, and an end-determining step for determining the end point of said developing step, with reference to a reference time between the time preceding a changing point of the electrochemical parameter by a predetermined period and the time following the changing point of the parameter by another predetermined period.

According to another aspect of the present invention, there is provided a pattern developing apparatus which develops a conductor on which a resist film and a predetermined pattern are successively formed, comprising a developing bath in which a developing solution containing an organic solvent is stored and in which the conductor is dipped, an electrode which is dipped in the developing solution in the developing bath and which exhibits a stable potential in the developing solution, and detecting means for detecting the changing point of an electrochemical parameter between the conductor and the electrode, thereby determining the end point of said developing step, with reference to a reference time between the time preceding a changing point of the electrochemical parameter by a predetermined period and the time following the changing point of the parameter by another predetermined period.

According to the present invention, the capacitance between a conductor and a developer changes largely around the time at which a resist pattern on the conductor is removed by the developer and the conductor is exposed. Thus, the changing point of an electrochemical parameter between the conductor and the electrode is detected on the basis of the change in capacitance.

For this reason, an appropriate developing time or the time to the end of the developing step can be determined with reference to the time until the changing point appears or a given time interval therearound. Unlike the conventional method wherein a voltage exceeding a threshold value is detected to determine the end of development, completion of development is determined with reference to the changing point based on a change in capacitance. Therefore, a reference point for determining the end of the developing step becomes apparent, regardless of the object to be measured, and an optimal reference point can be uniquely determined by the same determination method.

Therefore, the size precision of the pattern can be significantly improved.

BRIEF DESCRIPTION OF THE DRAWINGS

FIG. 1 is a block diagram of a pattern developing apparatus according to first, second, and fourth, embodiments of the present invention;

FIG. 2 is a graph showing a change in capacitance between a photomask and a developer;

FIG. 3 is a graph showing a theoretical change in current in the case of FIG. 2;

FIGS. 6, 11, and 13 are graphs showing the relationship between a developing coefficient and a developed pattern width according to the first embodiment;

FIG. 22 is a plan view showing a photomask on which a pattern of a comparative example is formed; and FIG. 23 is a graph showing a current peak appearing when a current flowing between an electrode and a photomask is measured by a method according to the fourth embodiment of the present invention, in comparison with that in the comparative example.

DETAILED DESCRIPTION OF THE PREFERRED EMBODIMENTS

Figure 4:
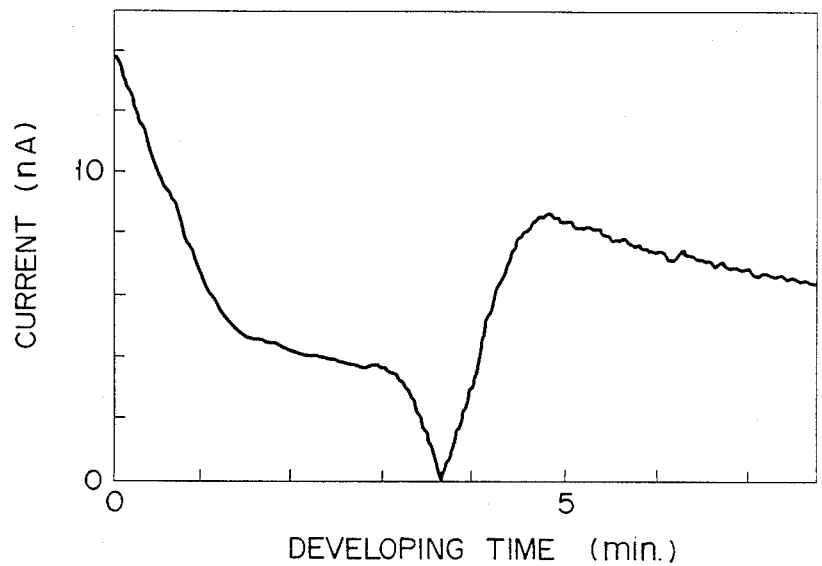
FIGS. 4, 5, 7, 8, 9, 10, and 14 are graphs showing a current peak appearing when a current flowing between an electrode and a photomask is measured according to the method of the first embodiment of the present invention.

A first embodiment of the present invention will now be described with reference to the accompanying drawings.

FIG. 1 is a block diagram showing an apparatus embodying a pattern developing method according to this embodiment. Reference numeral 1 denotes a developing bath, which contains developer 2. Photomask 3 as an object to be developed and electrode 4 are dipped in developer 2. Photomask 3 is prepared such that a chromium film is deposited on a glass substrate, an electron-beam resist is coated thereon, and a desired pattern is exposed on the resist by use of electron beam. One end of lead wire 8 is connected to the chromium underlying layer of photomask 3, and the other end thereof is connected to inverting input terminal 14 of operational amplifier 5. Output terminal 16 of operational amplifier 5 is connected to recorder 7, through signal line 11. One end of feedback resistor 6 is connected to signal line 12, and the other end thereof is connected to signal line 13. Signal lines 12 and 13 are connected to lead wire 8 and signal line 11, respectively. More specifically, inverting input terminal 14 and output terminal 16 of operational amplifier 5 are connected through feedback resistor 6. One end of lead wire 9 is connected to electrode 4, and the other end thereof is connected to noninverting input terminal 15 of operational amplifier 5. Lead wire 9 and recorder 7 are connected through signal line 10. In this way, operational amplifier 5 and feedback resistor 6 constitute a zero-shunt ammeter, and recorder 7 records a current value flowing between photomask 3 and electrode 4 when the potential difference between photomask 3 and electrode 4 is zero.

When a pattern is to be formed by the pattern developing apparatus as described above, photomask 3 and electrode 4 are dipped in developer 2 in developing bath 1, and a current value flowing therebetween is measured while developing a pattern formed on the resist on photomask 3. A current peak appears around the time at which the chromium underlying layer of photomask 3 is exposed, and is recorded in recorder 7. In this case, when an electrolyte is added to developer 2, a current peak appears more clearly. Next, the developing time is changed while observing the current waveform recorded in recorder 7, and the developed pattern width is measured. Thus, the developed pattern can have an appropriate width after a time, obtained by multiplying the time until the current peak appears or a time therearound by a predetermined coefficient (hereinafter called developing coefficient), has passed.

In the developing step, the time until the current peak appears depends on the developing rate of the resist. Parameters which influence the developing rate include the temperature of the developer, in addition to resist coating and electron beam exposure conditions, although they exert only a small influence. However, even if the developing rate is changed by the above parameter, the period until the current peak appears corresponds to the developing rate, and accordingly, the appropriate developing time obtained through multiplying the time until the current peak appears by the predetermined coefficient remains can changed since the changes of the developing rate have been compensated. Even if the temperature of the developer varies during a single developing step, the variation in developing rate can be compensated for as described above, during the time until the current peak appears. Therefore, the pattern width is influenced only by variations in temperature from the time the current peak appears until the time the developing ends. However, since this time is short with respect to the total developing time, the variations in temperature during the single developing step can only slightly influence the pattern width.

According to this embodiment, since the completion of development is determined with reference to the current peak, a clear reference point for determination can be obtained for each object to be measured. For this reason, an optimal reference point for determining the completion of development can be determined for each object. The completion of development is determined such that the current peak is detected and the time until the current peak appears is simply multiplied with a predetermined coefficient, resulting in a simple arrangement. In addition, variations in developing rate caused by variations in parameters (e.g., temperture of the developer) can be compensated for, and variations in temperature of the developer during the single developing step exert only a small influence. Therefore, variations in pattern width caused by variations in developing rate can be suppressed. For this reason, the precision in the size of the developed pattern can be significantly improved.

The reason why the current peak appears will be explained below. When photomask 3 is in a non-developed state, since the entire surface of the mask is normally covered with a resist having a thickness of several thousands of angstroms, the chromium underlying layer of the mask and the developer constitute a capacitor using the resist as a dielectric. In this case, the capacitance of the capacitor is normally a very small value (i.e., several tens of nF/cm$^2$). As development of the pattern exposed on the mask progresses, the resist corresponding to the portion exposed with the electron beam is dissolved, and the chromium underlying layer directly contacts the developer. Under this condition, a capacitor (a so-called electric double layer) is formed on the surface of the chromium underlying layer, and has a high capacitance of several $\mu$F/cm$^2$ to several tens of $\mu$F/cm$^2$, when compared with the capacitor including the resist. For this reason, when the development progresses and the developer reaches the chromium underlying layer, the capacitance between the chromium underlying layer and the developer abruptly increases, as shown in FIG. 2. During the development, since the chromium underlying layer of mask 3 and electrode 4 are short-circuited, a voltage is applied across the two ends of the capacitor formed by the chromium underlying layer and the developer. Assuming that the voltage in this case is given by V and the capacitance is given by C, cureent i flowing between photomask 3 and electrode 4 can be expressed by relation (1):

$$i = VdC/dt \qquad (1)$$

In this way, current i is proportional to a value obtained by differentiating capacitance C over time t. Therefore, as shown in FIG. 3, when the capacitance abruptly changes, a current peak appears.

Next, examples wherein patterns are developed in accordance with the above embodiment will be described.

EXAMPLE 1

An EBR-9 (trade name; available from TORAY INDUSTRIES, INC.: poly-2,2,2-trifluoroethyl-$\alpha$-chloroacrylate) was used as an electron-beam resist, an MIBK (methyl isobutyl ketone) was used as developer 2, and a platinum plate was used as electrode 4, and a current flowing between photomask 3 and electrode 4 was measured using the apparatus shown in FIG. 1. As a result, as shown in FIG. 4, a small current peak of about 9 nA appeared after about five minutes had passed from the beginning of the developing step. It was confirmed that the current peak appeared around the time at which the chromium underlying layer of photomask 3 was exposed.

Figure 5:
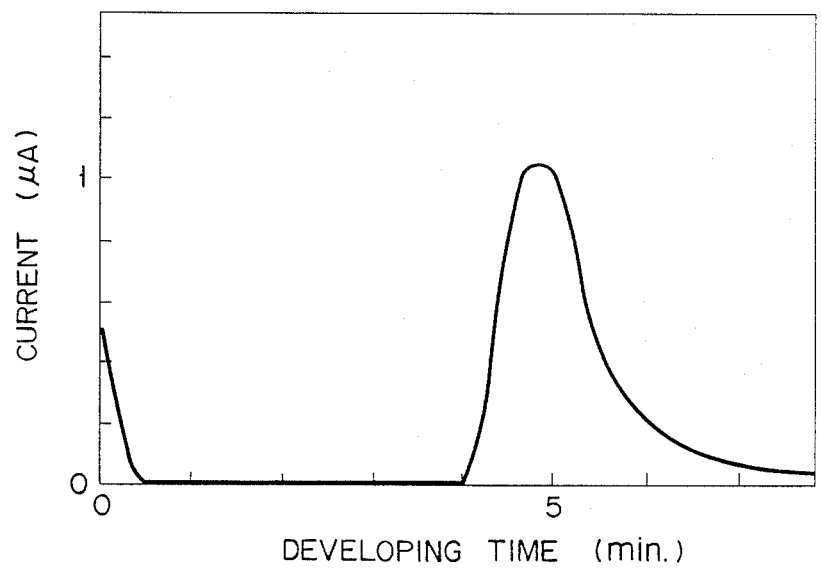

One mM of tetrabutyl ammonium perchlorate acting as an electrolyte was added to the MIBK, and the current flowing between photomask 3 and electrode 4 was measured. In this case, as shown in FIG. 5, one apparent current peak appeared after about five minutes had passed from the beginning of the developing step. It was found that the current peak was about 1 $\mu$A, which was about 100 times or more the current peak obtained when no electrolyte was added, and it had a good S/N ratio. It was also confirmed that this current peak appeared around the time at which the chromium underlying layer of photomask 3 was exposed.

Next, a pattern having a width of 4 $\mu$m was exposed on the EBR-9 coated on photomask 3, with electron beam, and was developed using the MIBK as developer 2 in the same manner as described above. In this case, the current was measured by the apparatus shown in FIG. 1, the resist pattern was developed while observing the current waveform recorded in recorder 7, and the actually developed pattern width was measured. Note that in the measuring of the pattern width, the developing coefficient was set between 1.2 to 2.0, to be changed stepwise in units of 0.2, and measurement was conducted twice for each developing coefficient. FIG. 6 is a graph showing the relationship between the developing coefficient and the pattern width, wherein the developing coefficient is plotted along the abscissa, and the pattern width after development is plotted along the ordinate. As can be seen from this graph, the developing coefficient and the pattern width have a linear relationship therebetween. When the developing coefficient in the case wherein the pattern width after development is 4 $\mu$m, corresponding to the width exposed by the electron beam, is obtained from this line, said coefficient is about 1.3. More specifically, when the resist and the developer of this embodiment are used, the completion of development can be determined to correspond to a value obtained by multiplying the time until the current peak appears, by about 1.3.

EXAMPLE 2

Figure 7:
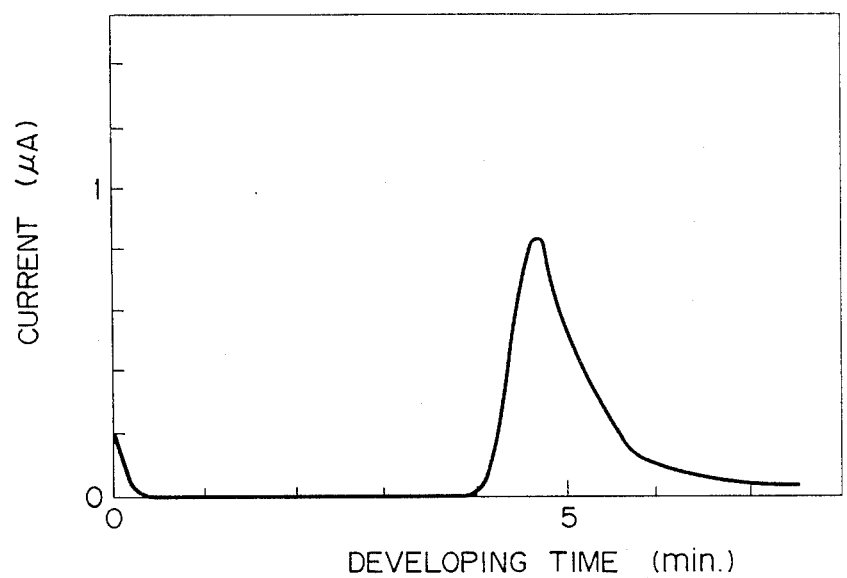

In this example, a photomask was prepared and was subjected to electron-beam exposure in the same manner as in Example 1, except that a PMMA (polymethyl methacrylate) was used as an electron-beam resist. Thereafter, a current flowing between the chromium underlying layer of photomask 3 and platinum electrode 4 was measured, while developing the resist pattern using the apparatus shown in FIG. 1. In this case, the MIBK to which 1 mM of tetrabutyl ammonium perchlorate was added, was used as the developer. FIG. 7 shows a change in current. As can be seen from FIG. 7, when the PMMA was used as the electron-beam resist, one apparent current peak appeared. Although not shown in this example, there was also confirmation of the relationship between the developing coefficient and the pattern width shown in FIG. 6.

EXAMPLE 3

Figure 8:
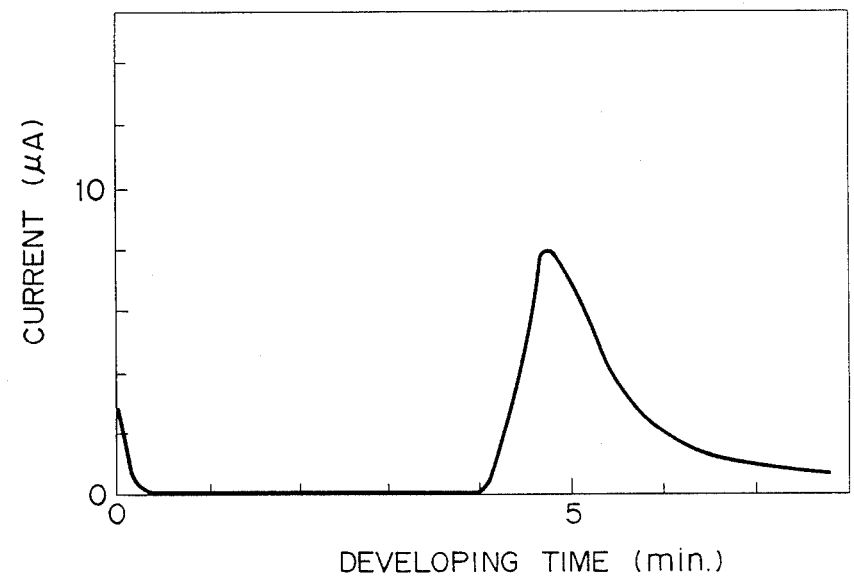

In this example, the MIBK was used as the developer, as in Examples 1 and 2, and an inorgainc material, for example, cerium (IV) ammonium nitrate, was added to the developer, unlike the organic material used in Examples 1 and 2. The photomask was prepared and was subjected to electron-beam exposure under the same conditions as in Example 1, except for the above. Thereafter, a current value flowing between photomask 3 and platinum electrode 4 was measured while developing the resist pattern using the apparatus shown in FIG. 1. FIG. 8 shows a change in current in this example. As can be seen from FIG. 8, when the inorganic material was added to the developer, one clear current peak appeared, as in Examples 1 and 2. When the current value was measured under the same conditions as in Example 1, the time until the currnt peak appeared was substantially the same as that in the case shown in FIG. 5. In this case, the current peak was 10 times or more that shown in FIG. 5. although not shown in this example, there was also confirmation of the relationship between the developing coefficient and the pattern width shown in FIG. 6.

When inorganic materials which have differnt valencies (e.g., cerium salt, iron salt, and the like) were used as an additive for the developer and were mixed to constitute a rdox system (e.g., a mixture of cerium (III) ammonium nitrate and cerium (IV) ammonium nitrate), a potential across the chromium underlying layer of photomask 3 and electrode 4 was stabilized. For this reason, the waveform of the measured current was stabilized, and this made determination of the completion of development easier.

EXAMPLE 4

Figure 9:
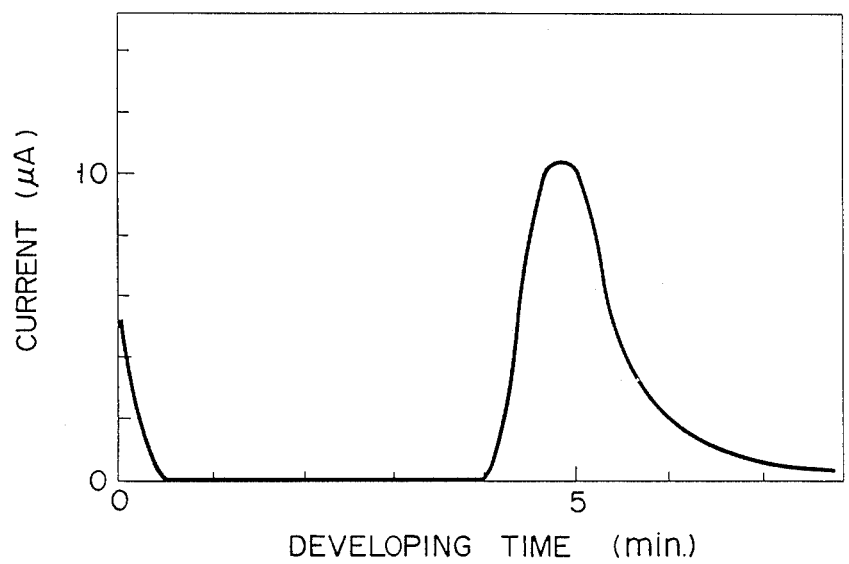

In this example, the photomask was prepared and was subjected to electron-beam exposure in the same manner as in Example 1, except that electrode 4 comprised a silver/silver chloride electrode. Thereafter, a current value flowing between the chromium film of photomask 3 and the silver/silver chloride electrode was measured while developing the resist pattern using the apparatus shown in FIG. 1. FIG. 9 shows a change in current in this example. As is apparent from FIG. 9, one noticeable current peak appeared after about five minutes had passed from the beginning of the developing step, and was about 10 μA, which was 10 times or more that in the case wherein electrode 4 comprised the platinum electrode as in Example 1, and it has a good S/N ratio. In this example, it was confirmed that the developing step progressed and the current peak then appeared around the time at which the chromium underlying layer of photomask 3 was exposed. In addition, when the current value was measured under the same conditions as in Example 1, the time until the current peak appeared was substantially the same as that in the case shown in FIG. 5. Also in this example, there was confirmation of the relationship between the developing coefficient and the pattern width shown in FIG. 6.

EXAMPLE 5

Figure 10:
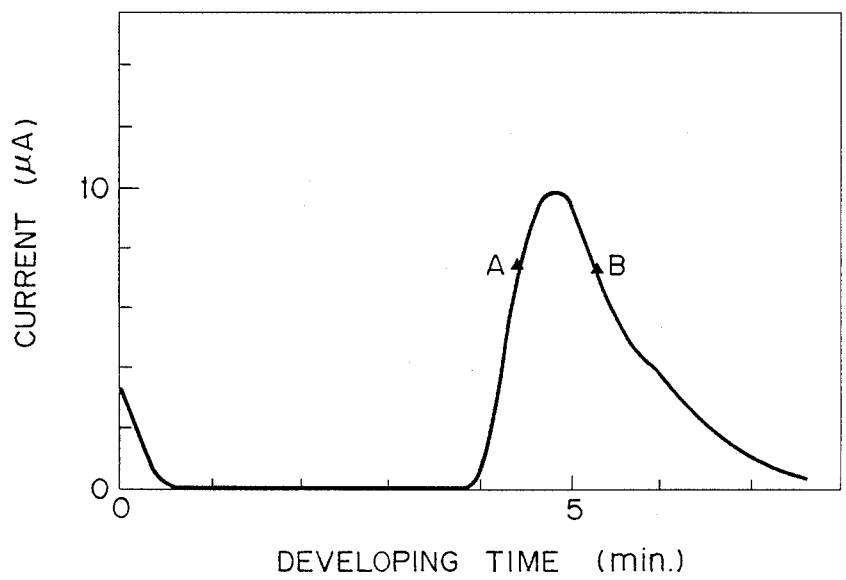

In this example, the time during which the current value reached X% of the current peak before it reached the current peak, or the time during which the current value fell back to X% of the currnt peak after it had reached the current peak, was used as a reference for optimally determining completion of development, in place of the current peak appearance time. The same measurement apparatus and the same object to be measured as in Example 4 were used, and a detailed description thereof is omitted. A change in current in this example was substantially the same as that obtained in Example 4 shown in FIG. 9, as shown in FIG. 10. In FIG. 10, reference symbol A represents a point at which the current value reached 75% of the current peak value before it reached the current peak; and B, a point at which the current value fell back to 75% of the current peak value after it had reached the current peak.

Figure 11:
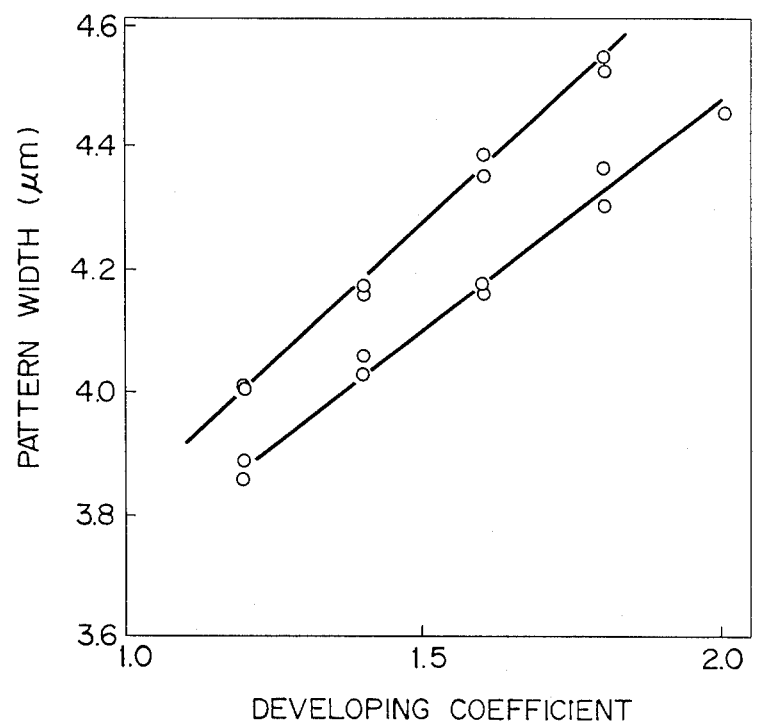

FIG. 11 shows the relationship between the developing coefficient and the pattern width determined with reference to these points. In this manner, it was found that the developing coefficient and the pattern width has a linear relationship therebetween, as in that of FIG. 6 which was obtained when the developing coefficient was determined with refernce to the current peak appearance time.

The same test was conducted for various patterns, and analysis was made using various values of X other than 75. As a result, when the value of X falling within the range of 10 to 100 (before the current value reached the current peak) was used, or when the value of X falling within the range of 40 to 100 (after the current value had reached the current peak) was used, it was found that the same relationship shown in FIG. 11 could be obtained, although the resultant values varied widely when the value of X was small.

As described above, it was found that if the relationship between the developing coefficient and the pattern width was predetermined, a time other than the current peak appearance time, which was determined with reference to the current peak, could be used as a reference for determining the appropriate developing time.

EXAMPLE 6

Figure 12:
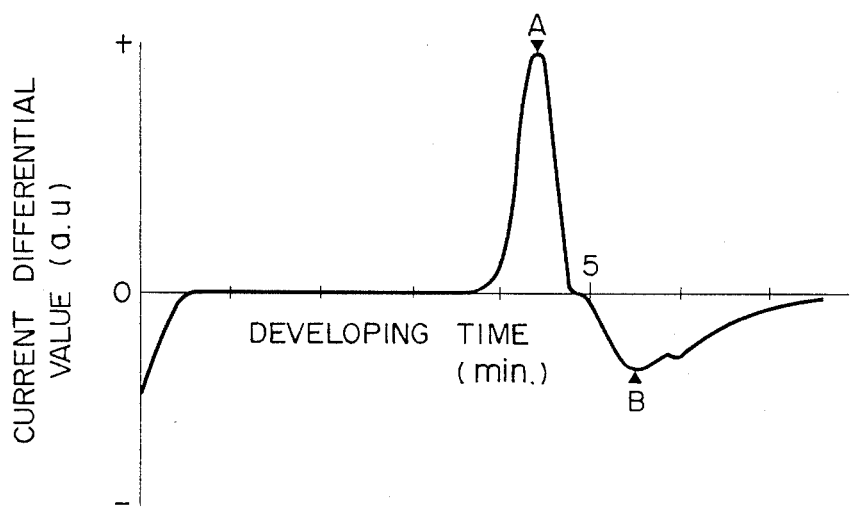
FIG. 12 is a graph showing a differential value of a current flowing between the electrode and the photomask according to the method of the first embodiment.

In this example, a time at which a differential value of the measured current represented its maximum or minimum value was used as a reference for optimally determining completion of development. The same measurement apparatus and the same object to be measured as in Example 4 were used, and a detailed description thereof is omitted. FIG. 12 shows a change in differential value of the current in this example. In FIG. 12, two points indicated by A and B represent, respectively, a point at which the differential value is at maximum, and at which it is at minimum.

Figure 13:
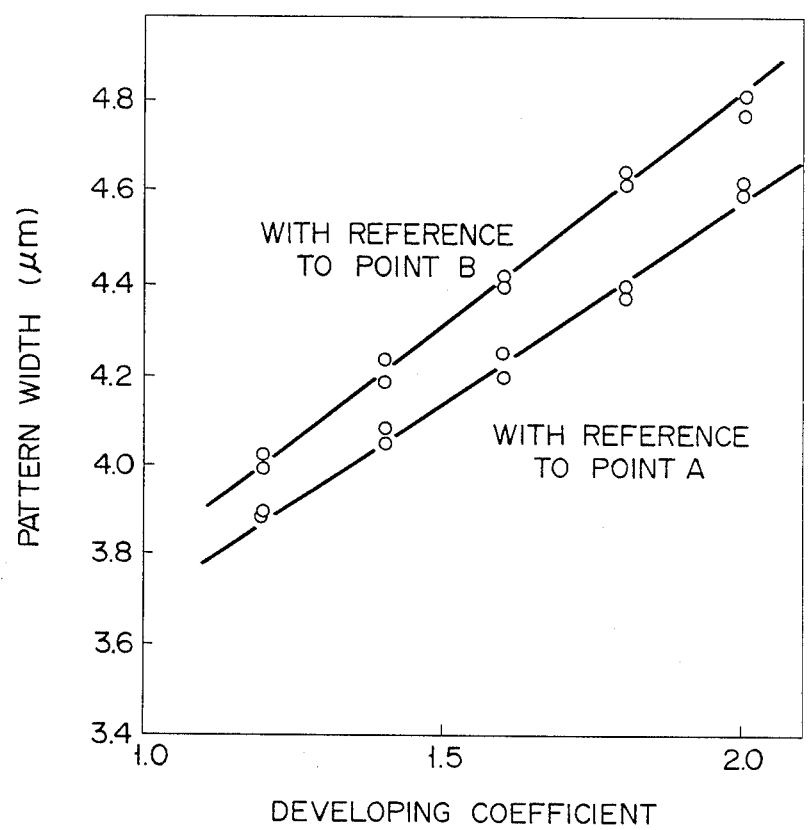

FIG. 13 shows the relationship between the developing coefficients and the pattern widths determined with reference to these points. The same test was conducted for various patterns. As a result, it was found that the developing coefficient and the pattern width had a linear relationship therebetween as that in FIG. 6, obtained when the developing coefficient was determined with reference to the peak current appearance time.

As described above, it was found that if the relationship between the developing coefficient and the pattern width was predetermined, the developing time could be appropriately determined with reference to the time representing the maximum or minimum differential value of the current.

EXAMPLE 7

Figure 14:
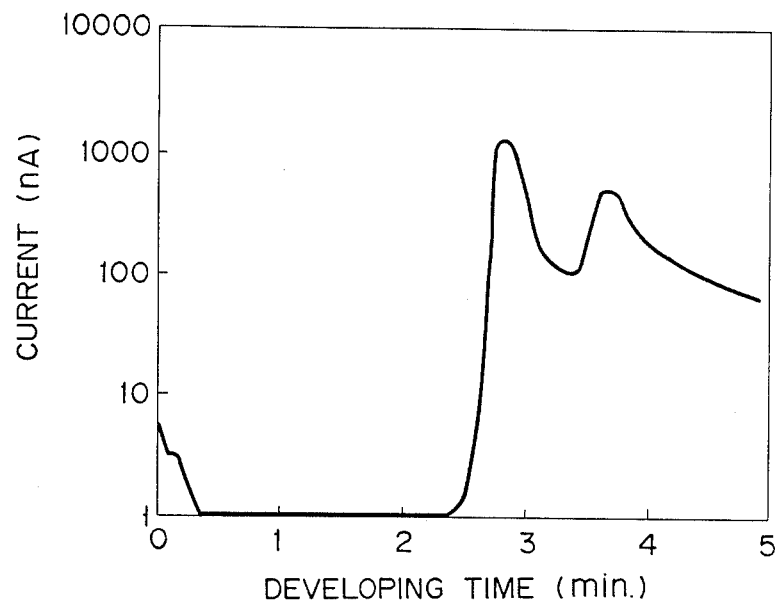

In this example, the PMMA as the electron-beam resist was coated on the photomask substrate having a quartz plate on which chromium was deposited, and 20 pairs of 2-$\mu$m lines and 2-$\mu$m spaces were formed thereon by electron-beam exposure and a pair of a 100-$\mu$m line and a 100-$\mu$m space was formed thereon by electron-beam exposure, thus preparing a photomask. The thus obtained photomask was dipped in the MIBK containing 1 mM of tetrabutyl ammonium perchlorate, to be developed, and a current value flowing between a silver/silver chloride electrode dipped in the developer and the underlying chromium film of the photomask was measured using the apparatus shown in FIG. 1. As a result, two current peaks appeared as shown in FIG. 14. Two photomasks for which the developing step was terminated respectively after time periods, 1.4 times those until the two current peaks appeared, had passed, were prepared, and were rinsed and etched. Next, the distance between lines and spaces formed on each of the two photomasks was measured. As a result, when the appearance time of the first current peak was used as a reference, the distance was 2.02 $\mu$m substantially equal to the distance in the pattern formed on the photomask by electron-beam exposusre. In contrast to this, when the second current peak was used as a reference, the distance was 2.18 $\mu$m. Thus, an appropriate pattern width can be obtained with reference to the first current peak. Similarly, the present inventors examined cases wherein a plurality of current peaks appeared. In any case, it was found that when the developing time was calculated with reference to the time until the first current peak appeared, an appropriate pattern width could be obtained.

Note that the relationship shown in FIG. 6 can be accomplished when a micropattern in the order of submicrons is to be obtained. When a ratio of the developing time to the peak appearance time is appropriately selected, the pattern width after development can be increased or decreased with respect to the width of a pattern formed on a photomask by electron-beam exposure.

When the developing coefficient was 1.1 in FIG. 6, a nondevelopd portion still remained, and the resist was left on the pattern portion, thus preventing pattern width measurement. In addition, the same effect as described above could be obtained when an organic material which was dissolved and ionized in the developer, such as tetralkyl ammonium perchlorate (e.g., tetraethyl ammonium perchlorate) tetrafluoroborate, or hexafluorophosphate, was added to the developer.

Next, a second embodiment of the prsent invention will be described.

A current flowing between electrode 4 and photomask 3 is measured while developing a pattern formed on photomask 3, using the apparatus shown in FIG. 1, in the same manner as in the first embodiment. In this case, the developing time until the pattern has a given width, i.e., an appropriate developing coefficient, changes in accordance with the pattern area ratio, and the smaller the pattern area ratio, the smaller the developing coefficient. The current peak value also changes in accordance with the pattern area ratio, and the larger the pattern area ratio, the higher the current peak value. For this reason, when the relationship therebetwen is predetermined, a pattern area ratio of the photomask after development can be obtained from the current peak value, and an appropriate developing coefficient can be determined from the obtained pattern area ratio. Therefore, even if the pattern area ratio varies widely, a pattern can be developed with high size precision.

Examples wherein patterns were developed in accordance with this embodiment will be described below.

EXAMPLE 8

The EBR-9 as the electron-beam resist was coated on a photomask substrate having a quartz plate on which chromium was deposited, and was exposed by an electron-beam exposure apparatus to form a predetermined pattern thereon. In this case, patterns having pattern area ratios of 95% and 50% were chosen from various test patterns, and a 2-$\mu$m width pattern was formed thereon. The pattern having the 95% pattern area ratio was reversed to prepare a pattern having a 5% pattern area ratio. Using the photomasks having the pattern area ratios of 5%, 50%, and 95%, the current flowing between the photomask and the electrode was measured while developing the pattern, using the apparatus shown in FIG. 1. As a result, data shown in FIGS. 15 and 16 could be obtained. In this case, 5" square photomasks were used.

Figure 15:
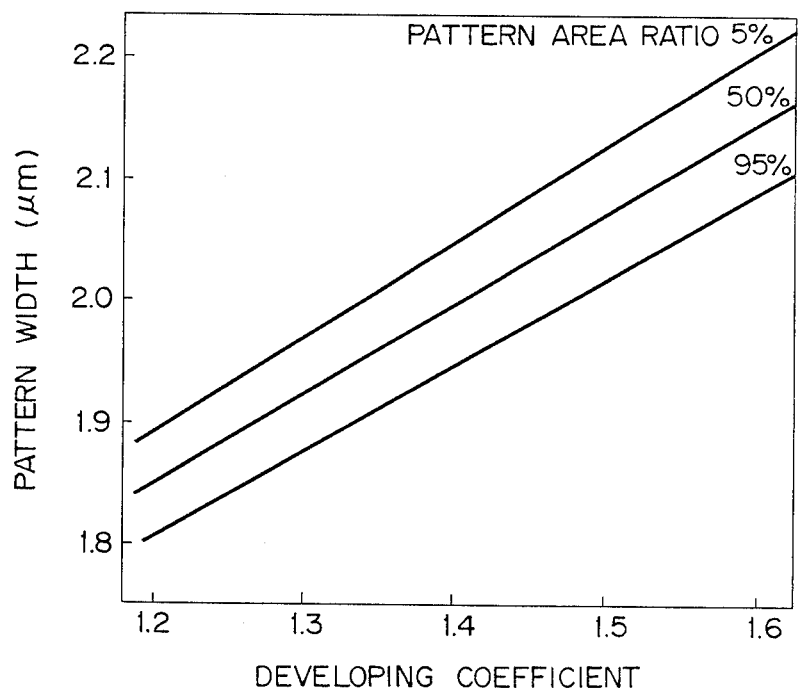
FIG. 15 is a graph showing a developing coefficient and a developed pattern width when the pattern area ratio is changed in a second embodiment of the present invention.

FIG. 15 is a graph showing the relationship between the developing coefficient and the pattern width for each pattern area ratio, wherein the developing coefficient is plotted along the abscissa, and the pattern width of the photomask after development is plotted along the ordinate. As can be seen from FIG. 15, the developing coefficients and the pattern widths have a linear relationship therebetween at any pattern area ratio, and inclinations thereof are substantially equal to each other. However, the positions of the lines are shifted, and the smaller the pattern area ratio, the larger the pattern width after development, regardless of the value of the developing coefficient. More specifically, the smaller the pattern area ratio, the smaller the developing coefficient for obtaining an appropriate pattern width. In this manner, since the appropriate developing coefficient differs in accordance with the pattern area ratios, when a developed pattern requires high precision, the developing coefficient is determined based on the pattern area ratio.

Figure 16:
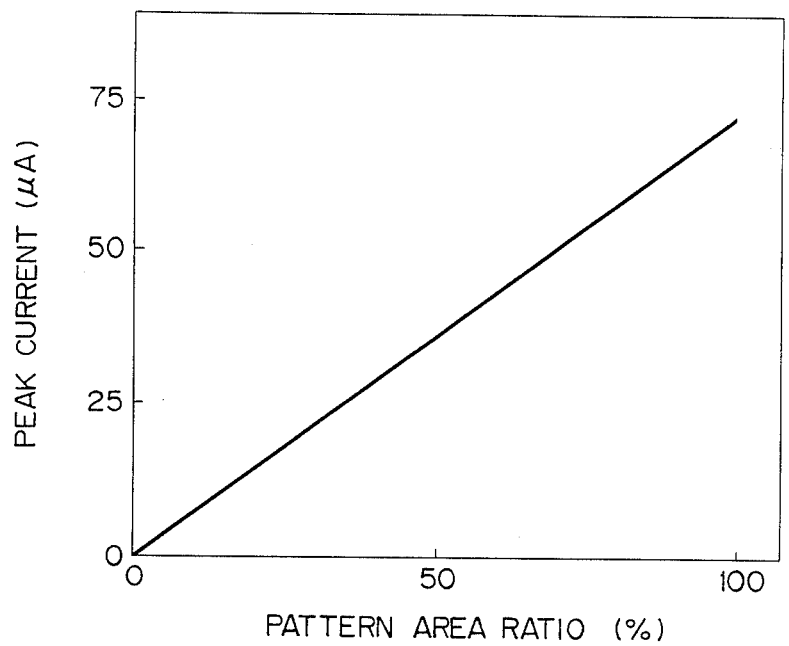
FIG. 16 is a graph showing the relationship between the pattern area ratio and the peak current value in the second embodiment of the present invention.

FIG. 16 is a graph showing the relationship between the pattern area ratio and the current peak value, wherein the pattern area ratio is plotted along the abscissa and the current peak value is plotted along the ordinate. As can be seen from FIG. 16, the current peak value increases linearly upon increase in the pattern area ratio of the photomask. Therefore, the pattern area ratio can be obtained in accordance with the current peak value.

Next, the width of the pattern developed in accordance with this example will be described in comparison with that of a pattern which is developed by fixing the developing coefficient to be 1.4. Two groups of 5" square substrates having the above three pattern area ratios were prepared. One group of substrates was developed while fixing the developing coefficient to be 1.4, and the other group of substrates was developed by the apparatus shown in FIG. 1, after the developing coefficients were determined in accordance with their pattern area ratios. These groups are named A and B groups. Table 1 shows the pattern widths after development in the A and B groups.

TABLE 1

| Area Ratio | Group A ($\mu m$) | Group B ($\mu m$) |
|---|---|---|
| 5% | 2.09 | 2.01 |
| 50% | 2.04 | 1.99 |
| 95% | 1.94 | 1.98 |

In this manner, according to this example, even when the pattern area ratios are considerably different, patterns can be developed with high precision.

A third embodiment of the present invention will now be described with reference to the accompanying drawings.

Figure 17:
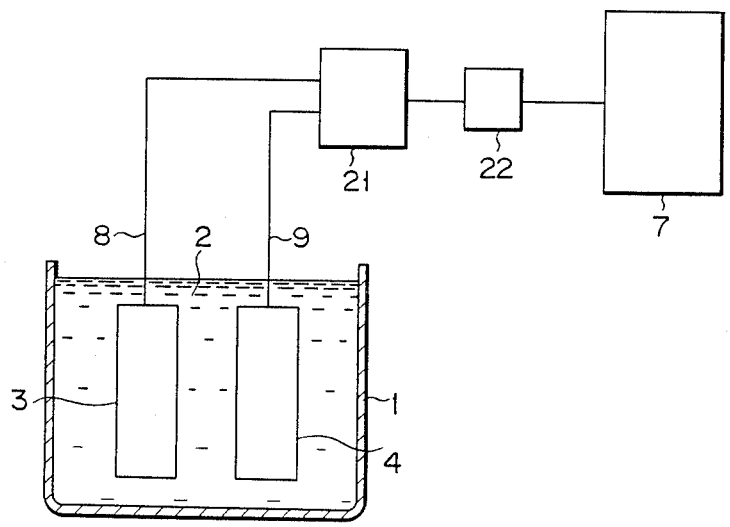
FIGS. 17 and 19 are block diagrams showing a pattern developing apparatus according to a third embodiment of the present invention.

FIG. 17 is a block diagram showing an apparatus for carrying out the pattern developing method of this embodiment. The same reference numerals in FIG. 17 denote the same parts as in FIG. 1, and a detailed description thereof will be omitted. Reference numeral 21 denotes a capacitance meter for measuring a capacitance between photomask 3 and electrode 4. Capacitance meter 21 is connected to photomask 3 and electrode 4 respectively through lead wires 8 and 9. Capacitance meter 21 is connected to the input terminal of recorder 7 through operational device 22, and the value of the capacitance output from capacitance meter 21 is differentiated by device 22 and is then recorded in recorder 7. A value obtained by differentiating a capacitance between photomask 3 and electrode 4 measured by capacitance meter 21, i.e., a value proportional to a current value flowing between photomask 3 and electrode 4, is recorded in recorder 7.

In order to form a pattern by the pattern developing apparatus, photomask 3 and electrode 4 are dipped in developer 2 in developing bath 1, and a capacitance therebetween is measured. The capacitance abruptly changes around the time at which the chromium underlying layer of photomask 3 is exposed. Next, in order to detect the point at which the capacitance changes, the value of the capacitance detected by capacitance meter 21 is inputed to device 22, and is differentiated thereby to output a value proportional to a current value between photomask 3 and electrode 4, to recorder 7. The changing point of the capacitance coincides with the peak which appears when the chromium underlying layer of photomask 3 is exposed and therearound, as where the current detected by the apparatus of FIG. 1. The developing time is determined with refernce to this peak, in the same manner as in the first embodiment, when the peak current value is measured. For this reason, a clear reference point for determining the completion of development can be obtained regardless of the object to be measured.

Examples wherein patterns were developed in accordance with this embodiment will be described below.

EXAMPLE 9

In this example, photomask 3, in which chromium was deposited on a quartz plate, and an EBR-9 as an electron-beam resist was coated thereon, was used. For a pattern to be formed on photomask 3, a pattern having a pattern area ratio of 30% was selected from 64K Bit D-RAM patterns, and was formed on photomask 3 by an electron-beam exposure apparatus. The thus prepared photomask was dipped in an MIBK containing 100 $\mu m$ of tetraethyl ammonium perchlorate, to be developed, and a capacitance between photomask 3 and electrode 4 at 10 Hz, i.e., a capacitance between the chromium undercoat of photomask 3 and developer 2, was measured using a capacitance meter 21 (available from Hewlett-Packard Co., 4192A). The measured value was differentiated by device 22, and was recorded in recorder 7. In this case, a silver/silver chloride electrode was used as electrode 4.

Figure 18:
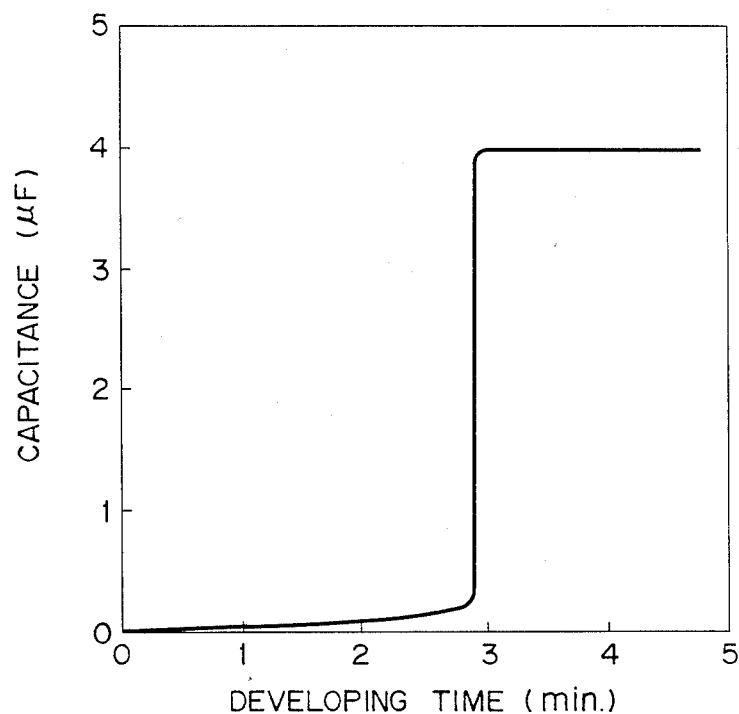
FIGS. 18 and 20 are graphs showing a change in capacitance between an electrode and a photomask in the third embodiment of the present invention.

FIG. 18 is a graph showing a change over time in capacitance between photomask 3 and electrode 4 detected by capacitance 21, wherein the developing time is plotted along the abscissa, and the capacitance is plotted along the ordinate. As can be seen from this graph, the capacitance abruptly changes after three minutes have passed from the beginning of the developing step. In practice, since the curve shown in FIG. 18 is differentiated and recorded in recorder 7, an apparent peak appears to correspond with the time until the capacitance abruptly changes, as described previously. When the operation described in the above embodiments is performed with reference to the peak appearance time, an appropriate developing time can be obtained.

EXAMPLE 10

In this example, by paying close attention to a stepwise increase in the capacitance in Example 9 shown in FIG. 18, a reference for optimally determining completion of development was determined.

Figure 19:
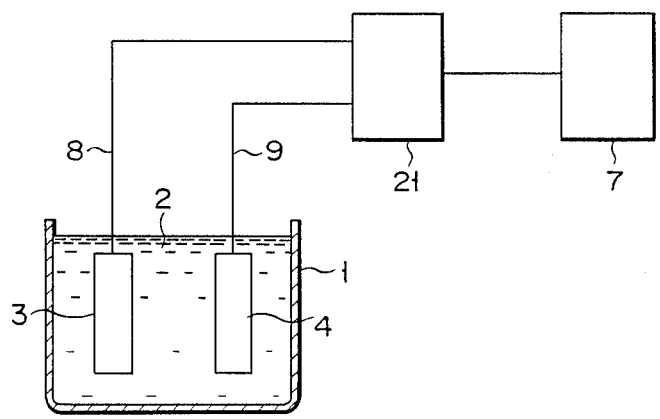
Figure 20:
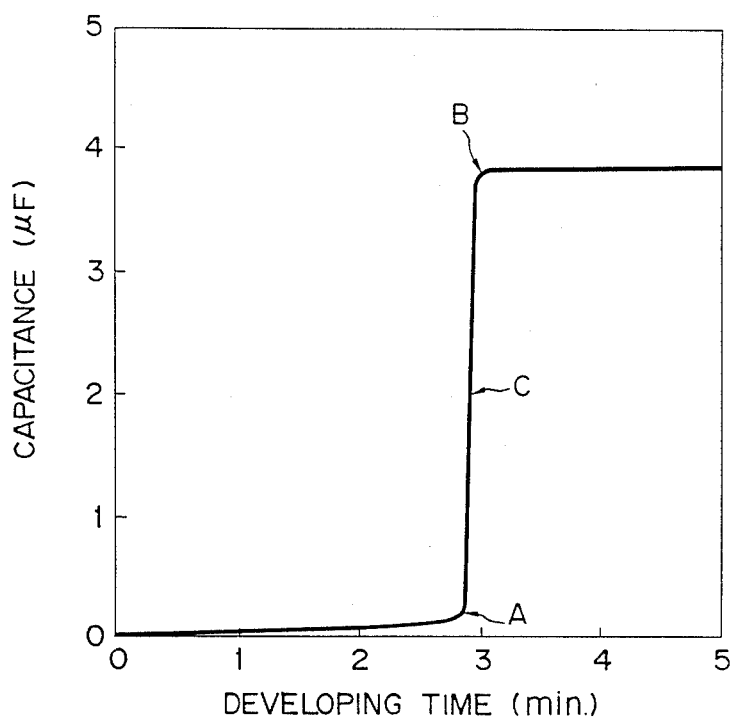

A measurement apparatus used in Example 9 was used, except that operational device 22 was omitted therefrom, as shown in FIG. 19. The same objects to be measured as in Example 9 were used, and a detailed description thereof is omitted. The change in capacitance is substantially the same as that obtained in Example 9 shown in FIG. 18, as shown in FIG. 20. In FIG. 20, three points indicated by A, B, and C represent, respectively, a point at which a capacitance begins to increase, a point at which an increase in capacitance is stopped, and a point which indicates an intermediate capacitance between those points A and B.

When the relationship between the pattern widths and the developing coefficients determined with reference to these points was examined, it was found that they had the same linear relationship therebetween as in FIG. 6, obtained when the developing coefficient was determined with reference to the current peak appearance time.

A similar test was conducted for various patterns, and analysis was made regarding point C as an arbitrary point between points A and B. As a result, a linear relationship was confirmed between the developing coefficients and the pattern widths for all the patterns tested. However, no significant difference was found between the developing coefficients and the pattern widths, even though any of points A, B, and C was used as a reference point for determining the developing coefficient.

It is considered that any difference in time between points A and B is at most several seconds, under normal developing conditions, and its influence vis-a-vis the pattern width is negligible in terms of current pattern size measurement precision.

As described above, it has been confirmed that if the relationship between the developing coefficient and the pattern width is predetermined, the point at which the capacitance abruptly changes can be used as a reference for determining an appropriate developing time.

Next, a fourth embodiment of the present invention will be described in detail.

A current flowing electrode 4 and photomask 3 is measured while developing a pattern formed on photomask 3 using the apparatus shown FIG. 1, in the same manner as in the first embodiment. In this case, if the pattern area ratio of the photomask is small, a peak will not clearly appear. For example, if the pattern area ratio is smaller than 5%, it is difficult to accurately determine the position of the current peak. For this reason, when the pattern area ratio is smaller than 5%, a pattern for determining the completion of development is formed on the photomask, to increase the pattern area ratio to be larger than 5%. Then, a current peak clearly appears, and the end of the pattern developing step can be determined with reference to this peak. Note that the pattern for determining the end of the developing step is used to increase the pattern area ratio, and need not be a special pattern. For example, in the manufacture of photomasks, an arbitrary pattern can be formed on a peripheral portion which is not used for circuit pattern formation in the shadow of an exposure apparatus during exposure. Similarly, in the direct exposure process, an arbitrary pattern can be formed on the peripheral portion of a semiconductor wafer on which a semiconductor chip cannot be mounted. Alternatively, the widths of the letters (e.g., a mask number) printed on the periphery of the mask can be increased, or their black-and-white portion can be locally reversed.

Next, an example wherein a pattern was developed in accordance with this embodiment will be described.

EXAMPLE 11

Figure 21:
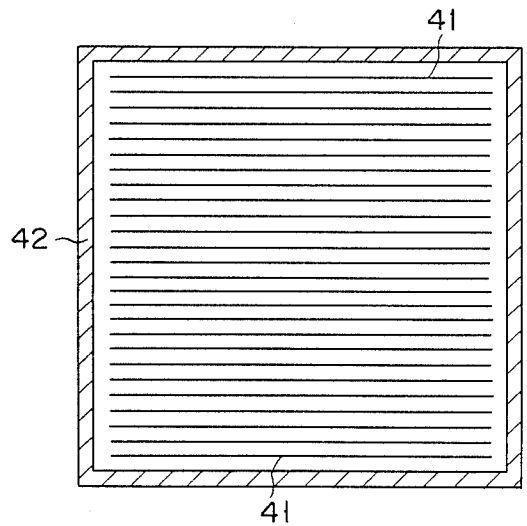
FIG. 21 is a plan view showing a photomask on which a pattern used in the fourth embodiment of the present invention is formed.

After a chromium film was deposited on a 125 mm×125 mm glass substrate, an EBR-9 as an electron-beam resist was coated thereon, and a pattern shown in FIG. 21 was formed thereon by electron-beam exposure, thus preparing a photomask. As shown in FIG. 21, 5-$\mu$m wide evaluation patterns 41 were formed at 5-mm intervals on the central portion of the photomask, and 5-mm wide strips patterns 42 for determining the completion of the developing step were formed on the periphery thereof. As a comparative example, a photomask on which only patterns 41 were formed was prepared, as shown in FIG. 22. In this case, the pattern area ratio of the photomask of this example is 13%, and the photomask of the comparative example is 0.1%.

The thus prepared photomasks were developed by the apparatus shown in FIG. 1, and a change in current value flowing between photomask 3 and electrode 4 was detected. As a result, in the comparative example, the current value to be measured was small, as indicated by the broken curve in FIG. 23, and a clear current peak could not be detected. However, when the pattern area ratio was increased using the development completion determination pattern as in this example, a clear current peak appeared, as indicated by the solid curve in FIG. 23.

When a pattern having a size (e.g., 100 $\mu$m×100 $\mu$m), larger than the standard size, is used as the development completion determination pattern, the first current peak of a pattern which generates a plurality of current peaks, shown in Example 7, can be enhanced. This is effective when the pattern area ratio is large.

In all the above embodiments, the photomask is used as the object to be developed. The present invention is not limited to this, however. For example, the present invention can be applied to an X-ray mask, a semiconductor wafer on which a pattern is formed directly thereon, and the like. The method of measuring an electrochemical parameter between an object to be developed and an electrode is not limited to the above-mentioned methods, but can be a method which can reliably detect a change in parameter (e.g., using a normal ammeter, a current detector, and the like). In the above embodiments, various materials which are ionized in the developer are used, but are not limited to those described above. They can be materials which can enhance a change in an electrochemical parameter. The electron-beam resist is not limited to that used in the above embodiments, but can be, for example, polymethyl methacrylate.

Note that the developing coefficient differs in accordance with the combination of electron-beam resist and developer, and can be determined accordingly.

What is claimed is:

1. A pattern developing process comprising:
   a resist-forming step of forming a resist film on a surface of a conductor;
   a pattern-forming step of forming a predetermined pattern on said resist film by an electron beam;
   a developing step of developing the pattern, such that said conductor on which the resist pattern is formed is dipped in a developer containing an organic solvent and an ionized material to selectively remove the resist film;
   a detecting step in which an electrode exhibiting a stable potential in the developer is dipped in the developer to detect a change in electrochemical parameter between said electrode and said conductor, based on a change in capacitance between said conductor and said developer; and
   an end-determining step for determining the end point of said developing step, with reference to a reference time between the time preceding a changing point of the electrochemical parameter by a predetermined period and the time following the changing point of the parameter by another predetermined period.

2. The process according to claim 1, wherein said changing point is the peak of the electrochemical parameter.

3. The process according to claim 2, wherein the electrochemical parameter is a current flowing between said electrode and said conductor.

4. The process according to claim 2, wherein the electrochemical parameter is a differential value of a capacitance between said electrode and said conductor.

5. The process according to claim 2, wherein the peak of the electrochemical parameter is the first peak appearing during the development.

6. The process according to claim 1, wherein the end of said developing step is the time calculated by multiplying the period taken until said reference time by a predetermined coefficient.

7. The process according to claim 6, wherein the end of said developing step is the time calculated by multiplying the period taken until the appearance of the peak of the electrochemical parameter by a predetermined coefficient.

8. The process according to claim 7, wherein the predetermined coefficient is determined by a pattern area ratio.

9. The process according to claim 8, wherein the pattern area ratio is determined from the peak of the electrochemical parameter.

10. The process according to claim 1, wherein said electrode is made of platinum.

11. The process according to claim 1, wherein said electrode is made of silver/silver chloride.

12. The process according to claim 1, wherein said conductor has a resist on which a pattern for determining the end of said developing step is formed in advance, and is developed in said pattern developing step to increase the resist removal area.

13. The process according to claim 12, wherein the resist removal area is not less than 5% of the surface area of the conductor.

14. The process according to claim 1, wherein the changing point in an inflection point of the electrochemical parameter.

15. The process according to claim 14, wherein the electrochemical parameter is a capacitance between said electrode and said conductor.

16. The process according to claim 1, wherein the changing point is an extremal value of the electrochemical parameter.

17. The process according to claim 16, wherein the electrochemical parameter is a differential value of a current flowing between said electrode and said conductor.

18. The process according to claim 17, wherein the extremal value is a maximum vlaue of the differential value of the current.

19. The process according to claim 17, wherein the extremal value is a minimum value of the differential value of the current.

* * * * *